US012598922B2

(12) United States Patent
Volkmann et al.

(10) Patent No.: US 12,598,922 B2
(45) Date of Patent: Apr. 7, 2026

(54) SYSTEMS AND METHODS FOR FABRICATING SUPERCONDUCTING INTEGRATED CIRCUITS

(71) Applicant: D-WAVE SYSTEMS INC., Burnaby (CA)

(72) Inventors: Mark H. Volkmann, Burnaby (CA); Reza Molavi, North Vancouver (CA); Jed D. Whittaker, Vancouver (CA)

(73) Assignee: D-WAVE SYSTEMS INC., Burnaby (CA)

( * ) Notice: Subject to any disclaimer, the term of this patent is extended or adjusted under 35 U.S.C. 154(b) by 775 days.

(21) Appl. No.: 17/793,151

(22) PCT Filed: Dec. 18, 2020

(86) PCT No.: PCT/US2020/066164
§ 371 (c)(1),
(2) Date: Jul. 15, 2022

(87) PCT Pub. No.: WO2021/146028
PCT Pub. Date: Jul. 22, 2021

(65) Prior Publication Data
US 2023/0101616 A1      Mar. 30, 2023

Related U.S. Application Data

(60) Provisional application No. 62/962,644, filed on Jan. 17, 2020.

(51) Int. Cl.
*H01L 39/02* (2006.01)
*H10N 60/01* (2023.01)
(Continued)

(52) U.S. Cl.
CPC ............. *H10N 60/80* (2023.02); *H10N 60/01* (2023.02); *H10N 69/00* (2023.02)

(58) Field of Classification Search
CPC ........ H10N 60/80; H10N 60/01; H10N 69/00; H10N 60/0912; H10N 60/12; H10N 60/81
See application file for complete search history.

(56) References Cited

U.S. PATENT DOCUMENTS

| | | |
|---|---|---|
| 3,582,851 A | 6/1971 | Meservey |
| 4,009,479 A | 2/1977 | Cardinne et al. |
| (Continued) | | |

FOREIGN PATENT DOCUMENTS

| | | |
|---|---|---|
| EP | 0445657 B1 | 5/1996 |
| JP | S63124585 A | 5/1988 |
| (Continued) | | |

OTHER PUBLICATIONS

Blanquart, "Evaluation and Comparison of Novel Precursors for Atomic Layer Deposition of Nb2O2 Thin Films", Chemistry of Materials, 24(6), pp. 975-980, Mar. 27, 2012.
(Continued)

*Primary Examiner* — Jarrett J Stark
(74) *Attorney, Agent, or Firm* — Cozen O'Connor

(57) ABSTRACT

Methods for mitigating microwave crosstalk and forming a component in a superconducting integrated circuit are discussed. Mitigating microwave crosstalk involves forming a microwave shield within the superconducting integrated circuit, the superconducting integrated circuit including a microwave sensitive component. The microwave shield is formed from a base layer and one or more sides, and the footprint of the microwave sensitive component is contained within the footprint of the microwave shielding base layer, with the one or more sides extending around at least a portion of the microwave sensitive component. Forming a component involves depositing a first metal layer, depositing a dielectric layer overlying the first metal layer, the dielectric layer comprising $Nb_2O_5$ that is deposited by atomic layer
(Continued)

deposition, and depositing a second metal layer overlying the dielectric layer.

9 Claims, 10 Drawing Sheets

(51) Int. Cl.
      *H10N 60/80*       (2023.01)
      *H10N 69/00*       (2023.01)

(56)                References Cited

U.S. PATENT DOCUMENTS

| | | | |
|---|---|---|---|
| 4,409,579 A | 10/1983 | Clem | |
| 4,740,758 A | 4/1988 | Ries | |
| 5,173,660 A | 12/1992 | Marsden | |
| 5,280,241 A | 1/1994 | Ueda et al. | |
| 5,623,240 A | 4/1997 | Sakuraba et al. | |
| 5,812,042 A | 9/1998 | Maki et al. | |
| 6,518,673 B2 | 2/2003 | Herr et al. | |
| 6,838,694 B2 | 1/2005 | Esteve et al. | |
| 6,911,664 B2 | 6/2005 | Il et al. | |
| 6,984,846 B2 | 1/2006 | Newns et al. | |
| 7,335,909 B2 | 2/2008 | Amin et al. | |
| 7,432,705 B2 | 10/2008 | Seki et al. | |
| 7,533,068 B2 | 5/2009 | Maassen et al. | |
| 7,619,437 B2 | 11/2009 | Thom et al. | |
| 7,624,088 B2 | 11/2009 | Johnson et al. | |
| 7,676,903 B1 | 3/2010 | Weller et al. | |
| 7,687,938 B2 | 3/2010 | Bunyk et al. | |
| 7,898,282 B2 | 3/2011 | Harris et al. | |
| 7,990,662 B2 | 8/2011 | Berkley et al. | |
| 8,008,942 B2 | 8/2011 | Van et al. | |
| 8,190,548 B2 | 5/2012 | Choi | |
| 8,195,596 B2 | 6/2012 | Rose et al. | |
| 8,264,300 B2 | 9/2012 | Cisco | |
| 8,421,053 B2 | 4/2013 | Bunyk et al. | |
| 8,441,330 B2 | 5/2013 | Uchaykin | |
| 9,768,371 B2 | 9/2017 | Ladizinsky et al. | |
| 9,836,688 B2 | 12/2017 | Dancausse et al. | |
| 9,836,699 B1 * | 12/2017 | Rigetti | H10N 60/815 |
| 10,134,972 B2 | 11/2018 | Oliver et al. | |
| 10,424,711 B2 | 9/2019 | Schoelkopf et al. | |
| 10,658,424 B2 | 5/2020 | Oliver et al. | |
| 10,769,546 B1 * | 9/2020 | Rigetti | H01L 21/76891 |
| 10,938,346 B2 | 3/2021 | Berkley et al. | |
| 11,011,693 B2 * | 5/2021 | Lampert | H10N 60/128 |
| 11,038,095 B2 | 6/2021 | Huang et al. | |
| 11,121,301 B1 | 9/2021 | Marshall et al. | |
| 11,184,006 B2 * | 11/2021 | Wang | B82Y 10/00 |
| 11,223,355 B2 * | 1/2022 | Smith | H03K 17/92 |
| 11,436,516 B2 | 9/2022 | Kelly et al. | |
| 11,856,871 B2 | 12/2023 | Lanting et al. | |
| 2003/0038286 A1 | 2/2003 | Van et al. | |
| 2003/0183935 A1 | 10/2003 | Herr et al. | |
| 2003/0218872 A1 | 11/2003 | Tsukada et al. | |
| 2004/0087081 A1 | 5/2004 | Aitchison et al. | |
| 2004/0232912 A1 | 11/2004 | Tsukamoto et al. | |
| 2006/0147154 A1 | 7/2006 | Thom et al. | |
| 2006/0225165 A1 | 10/2006 | Maassen et al. | |
| 2008/0238531 A1 | 10/2008 | Harris | |
| 2009/0312186 A1 | 12/2009 | Norem et al. | |
| 2009/0317958 A1 | 12/2009 | Tang et al. | |
| 2013/0029848 A1 | 1/2013 | Gonzalez et al. | |
| 2014/0264287 A1 * | 9/2014 | Abraham | H01P 3/026 257/31 |
| 2015/0357550 A1 * | 12/2015 | Schoelkopf, III | H10N 60/83 |
| 2015/0372217 A1 | 12/2015 | Schoelkopf et al. | |
| 2018/0013052 A1 * | 1/2018 | Oliver | H10N 60/805 |
| 2023/0101616 A1 | 3/2023 | Volkmann et al. | |

FOREIGN PATENT DOCUMENTS

| | | |
|---|---|---|
| JP | S63209185 A | 8/1988 |
| JP | H03255981 A | 11/1991 |
| JP | H04276594 A | 10/1992 |
| KR | 101465645 B1 | 11/2014 |
| WO | 9609654 A1 | 3/1996 |
| WO | 9914800 A1 | 3/1999 |

OTHER PUBLICATIONS

Diniz et al., "Intrinsic photon loss at the interface of superconducting devices", arXiv1909.04720v1, Sep. 10, 2019.

D-Wave Whitepaper, "Improved coherence leads to gains in quantum annealing performance", D-Wave, 2019, 4 pages.

Zednicek, Niobium and Niobium Oxide Capacitors Overview, Passive Components Blog, 2019.

Macco, et al., "Atomic-layer deposited Nb2O5 as transparent passivating electron contact for c-Si solar cells", Solar Energy Materials and Solar Cells, vol. 184, pp. 98-104, Sep. 2018.

Harris et al., "Experimental Investigation of an Eight-Qubit Unit Cell in a Superconducting Optimization Processor," arXiv:1004.1628v2, Jun. 28, 2010, 16 pages.

Brecht, et al., "Multilayer Microwave Integrated Quantum Circuits for Scalable Quantum Computing", npj Quantum Information (2016) 16002.

Ilichev, et al., "Continuous Monitoring of Rabi Oscillations in a Josephson Flux Qubit", Physical Review Letters 91(9): 097906-1-097906-4, week ending Aug. 19, 2003.

Stan, et al., "Critical Field for Complete Vortex Expulsion from Narrow Superconducting Strips", Physical Review 3 Letters, vol. 92, No. 9, Mar. 5, 2004.

Blatter et al., "Design aspects of superconducting-phase quantum bits," Physical Review B 63: 174511-1-174511-9, 2001.

F. Pobell, "Matter and Methods at Low Temperatures", Springer-Verlag, 2nd Edition, 1996.

Farhi et al., "Quantum Adiabatic Evolution Algorithms versus Simulated Annealing," MIT-CTP #3228, arXiv:quant-ph/0201031 v1, pp. 1-16, Jan. 8, 2002.

Feynman, "Simulating Physics with Computers," International Journal of Theoretical Physics 21(6/7): 467-488, 1982.

Friedman et al., "Quantum superposition of distinct macroscopic states," Nature 406:43-46, Jul. 6, 2000.

Il'ichev et al., "Continuous Monitoring of Rabi Oscillations in a Josephson Flux Qubit," Physical Review Letters 91(9): 097906-1-097906-4, week ending Aug. 29, 2003.

International Search Report & Written Opinion—PCT/US2020/066164.

Lanting et al., "Geometrical dependence of the low-frequency noise in superconducting flux qubits", Physical Review B, 79, Jun. 5, 2009, Jun. 5, 2009, 4 pages.

Makhlin et al., "Quantum-state engineering with Josephson-junction devices," Reviews of Modern Physics 73 (2):357-400, Apr. 2001.

Mooij et al., "Josephson Persistent-Current Qubit," Science 285:1036-1039, Aug. 13, 1999.

Nielsen et al., Quantum Computation and Quantum Information, Cambridge University Press, Cambridge, 2000, "7.8 Other implementation schemes," pp. 343-345.

Orlando et al., "Superconducting persistent-current qubit," Physical Review B 60(22):15398-15413, Dec. 1, 1999.

Shor, "Introduction to Quantum Algorithms," AT&T Labs—Research, arXiv:quant-ph/0005003 v2, pp. 1-17, Jul. 6, 2001.

Unknown, "Slow-Wave Structures", Microwaves101.com, Jan. 15, 2021—Available at least as early as Jul. 4, 2018.

Nagasawa, et al., "Development of advanced Nb process for SFQ circuits", Science Direct, Jun. 9, 2004, 8 pages.

Satoh, et al., "Fabrication process of planarized multi-layer Nb integrated circuits", IEEE, Jun. 13, 2005, 4 pages.

Satoh, et al., "Planarization of Josephson junctions for large-scale integrated Nb SFQ circuits by mechanical polishing", Science Direct, 1999, 4 pages.

* cited by examiner

SYSTEMS AND METHODS FOR FABRICATING SUPERCONDUCTING INTEGRATED CIRCUITS

FIELD

This disclosure generally relates to systems and methods for fabrication of superconducting integrated circuits, and in particular relates to reducing noise from microwave devices and providing dielectric materials with improved characteristics.

BACKGROUND

Superconducting Processor

A quantum processor may take the form of a superconducting processor. However, superconducting processors may include processors that are not intended for quantum computing. For instance, some implementations of a superconducting processor may not focus on quantum effects such as quantum tunneling, superposition, and entanglement but may rather operate by emphasizing different principles, such as for example the principles that govern the operation of classical computer processors. However, there may still be certain advantages to the implementation of such superconducting "classical" processors. Due to their natural physical properties, superconducting classical processors may be capable of higher switching speeds and shorter computation times than non-superconducting processors, and therefore it may be more practical to solve certain problems on superconducting classical processors. The present systems and methods are particularly well-suited for use in fabricating both superconducting quantum processors and superconducting classical processors.

Superconducting Qubits

Superconducting qubits are a type of superconducting quantum device that may be included in a superconducting integrated circuit. Superconducting qubits may be separated into several categories depending on the physical property used to encode information. For example, superconducting qubits may be separated into charge, flux and phase devices. Charge devices store and manipulate information in the charge states of the device. Flux devices store and manipulate information in a variable related to the magnetic flux through some part of the device. Phase devices store and manipulate information in a variable related to the difference in superconducting phase between two regions of the device. Recently, hybrid devices using two or more of charge, flux and phase degrees of freedom have been developed. Superconducting qubits commonly include at least one Josephson junction. A Josephson junction is a small interruption in an otherwise continuous superconducting current path and is typically realized by a thin insulating barrier sandwiched between two superconducting electrodes. Thus, a Josephson junction is usually formed as a three-layer or "trilayer" structure. Superconducting qubits are further described in, for example, U.S. Pat. Nos. 7,876,248, 8,035,540, and 8,098,179.

Integrated Circuit Fabrication

An integrated circuit is also referred to in the present application as a chip, and a superconducting integrated circuit is also referred to in the present application as a superconducting chip.

Traditionally, the fabrication of superconducting integrated circuits has not been performed at state-of-the-art semiconductor fabrication facilities. This may be due to concern that some of the materials used in superconducting integrated circuits may contaminate the semiconductor facilities. For instance, gold may be used as a resistor in superconducting circuits, but gold may contaminate a fabrication tool used to produce complementary metal-oxide-semiconductor (CMOS) wafers in a semiconductor facility.

Superconductor fabrication has typically been performed in research environments where standard industry practices could be optimized for superconducting circuit production. Superconducting integrated circuits are often fabricated with tools that are traditionally used to fabricate semiconductor chips or integrated circuits. Due to issues unique to superconducting circuits, not all semiconductor processes and techniques are necessarily transferrable to superconductor chip manufacture. Transforming semiconductor processes and techniques for use in superconductor chip and circuit fabrication often requires changes and fine adjustments. Such changes and adjustments typically are not obvious and may require a great deal of experimentation. The semiconductor industry faces problems and issues not necessarily related to the superconducting industry. Likewise, problems and issues that concern the superconducting industry are often of little or no concern in standard semiconductor fabrication.

Any impurities within superconducting chips may result in noise which may compromise or degrade the functionality of the superconducting chip. Noise may also compromise or degrade the functionality of individual devices such as superconducting qubits. Since noise is a serious concern to the operation of quantum computers, measures should be taken to reduce noise wherever possible.

Noise in a Quantum Processor

Low-noise is a desirable characteristic of quantum devices. Noise may compromise or degrade the functionality of the individual devices and the entire superconducting processor, as discussed above. Noise may negatively affect qubit coherence and reduce the efficacy of qubit tunneling. Since noise is a serious concern to the operation of quantum processors, measures should be taken to reduce noise wherever possible so that a transition from coherent to incoherent tunneling is not induced by the environment.

Impurities may be deposited on the metal surface and/or may arise from an interaction with the etch/photoresist chemistry and the metal. Noise may be caused by impurities on the upper surface of the quantum processor. In some cases, superconducting devices that are susceptible to noise are fabricated in the top wiring layers of a superconducting integrated circuit and are thus sensitive to post-fabrication handling. There is a risk of introducing impurities that cause noise during post-fabrication handling. One approach to reducing noise is using a barrier passivation layer, for example, an insulating layer, to overlie the topmost wiring layer. The use of a barrier passivation layer to minimize noise from impurities on the upper surface of a quantum processor is described in US Patent Application Publication No. 2018/0221915QA1.

Noise may also result from an external environment or surrounding circuitry in a superconducting processor. In a quantum processor, flux noise on qubits interferes with properly annealing the quantum processor because of the steep transition between qubit states as the flux bias is swept. Flux noise may be a result of current flowing through wiring of other devices included in the superconducting processor and may have a particularly negative effect on qubits at their respective degeneracy points. For example, flux noise may introduce errors in calculations carried out by the superconducting processor due to inaccuracies in setting flux bias and coupling strength values. Such values are important to using an integrated circuit as part of a quantum processor. Much of the static control error may be designed out of the processor with careful layout and high-precision flux sources, as well as by adding circuitry, such as an on-chip shield, to tune away any non-ideal flux qubit behavior. However, in many cases, limitations in integrated circuit fabrication capabilities may make it difficult to address noise by changing processor layout and adding circuitry. There is thus a general desire for systems and methods to for fabricating integrated circuits that have reduced flux noise.

Shielding

Magnetic fields produced by external sources may cause unwanted interactions with devices in the integrated circuit. Accordingly, there may be a need for a superconducting shield proximate to devices populating the integrated circuit to reduce the strength of interference such as magnetic and electrical fields. An example of this is discussed in WO 96/09654.

Superconducting shielding incorporated into an integrated circuit has been used to protect superconducting quantum interference device (SQUID) packages from DC and AC noise, such as magnetic and electrical fields, that would otherwise interfere with operation of the integrated circuit. Regions of the integrated circuit may be unshielded to allow for communication between magnetic and electrical fields external to the SQUID package. An example of this approach is discussed in U.S. Pat. No. 5,173,660.

Superconducting shielding layers may be used in single flux quantum (SFQ) or rapid single flux quantum (RSFQ) technology to separate devices from DC power lines that could otherwise undesirably bias the devices. The devices populate the integrated circuit but are separated from the DC power lines by placing a ground plane between the devices and the DC power line. Examples of this type of approach are described, for example, in Nagasawa et al., "Development of advanced Nb process for SFQ circuits" Physica C 412-414 (2004) 1429-1436 (herein referred to as Nagasawa) and Satoh et al., "Fabrication Process of Planarized Multi-Layer Nb Integrated Circuits" IEEE Transactions on Applied Superconductivity, Vol. 15, No. 2, (June 2005).

In SFQ circuits, ground planes and shielding layers are terminologies used interchangeably. A ground plane in SFQ integrated circuit is a layer of metal that appears to most signals within the circuit as an infinite ground potential. The ground plane helps to reduce noise within the integrated circuit but may be used to ensure that all components within the SFQ integrated circuits have a common potential to compare voltage signals. Nagasawa shows the use of contacts between wiring layers and a ground plane throughout SFQ circuitry.

Supercurrent flowing in superconducting wires has an associated magnetic field in the same manner as electrons flowing in normal metal wires. Magnetic fields may couple inductively to superconducting wires, inducing currents to flow. Quantum information processing with superconducting integrated circuits necessarily involves supercurrents moving in wires, and hence associated magnetic fields.

The quantum properties of quantum devices are very sensitive to noise, and stray magnetic fields in superconducting quantum devices may negatively impact the quantum information processing properties of such circuits. Superconducting ground planes have been used in the art to reduce cross-talk between control lines and devices. However, such approaches have only been used in superconducting integrated circuits for classical processing and sensor applications, which are relatively robust against in-circuit noise and operate at significantly higher temperatures as compared with superconducting quantum processing integrated circuits.

The foregoing examples of the related art and limitations related thereto are intended to be illustrative and not exclusive. Other limitations of the related art will become apparent to those of skill in the art upon a reading of the specification and a study of the drawings.

BRIEF SUMMARY

According to an aspect, there is provided a method of mitigating microwave crosstalk in a superconducting integrated circuit, the superconducting integrated circuit comprising a microwave sensitive component, the microwave sensitive component having a footprint, the method comprising forming a microwave shielding base layer to at least partially shield the microwave sensitive component, the microwave shielding base layer having a footprint, and forming one or more sides extending from the microwave shielding base layer to at least partially shield the microwave sensitive component, wherein the footprint of the microwave sensitive component is contained within the footprint of the microwave shielding base layer and the one or more sides extend around at least a portion of the microwave sensitive component, and the microwave shielding base layer and the one or more sides form at least a portion of a microwave shield.

According to other aspects, forming a microwave shielding base layer to at least partially shield the microwave sensitive component may comprise forming the microwave shielding base layer to underlie the microwave sensitive component, the method may further comprise forming a microwave shielding top layer to at least partially shield the microwave sensitive component, the microwave shielding top layer may overlie the microwave sensitive component, and the microwave shielding base layer, the one or more sides and the microwave shielding top layer forming the microwave shield, forming the one or more sides may comprise forming the one or more sides to connect the microwave shielding base layer and the microwave shielding top layer, forming the one or more sides may comprises forming one or more vias, and forming at least one of a microwave shielding base layer and one or more sides extending from the microwave shielding base layer may comprise forming the at least one of a microwave shielding base layer and one or more sides from one or more of aluminum and niobium.

According to an aspect, there is provided a superconducting integrated circuit comprising a microwave sensitive component and a microwave shield, the microwave shield comprising a microwave shielding base layer and one or more sides that extend from the microwave shielding base layer, the microwave shielding base layer having a footprint, the microwave shield sized and positioned such that a footprint of the microwave sensitive component is contained within the footprint of the microwave shielding base layer and the one or more sides extend around at least a portion of the microwave sensitive component.

According to other aspects, the microwave shielding base layer may underlie the microwave sensitive component, the superconducting integrated circuit may further comprise a microwave shielding top layer overlying the microwave sensitive component, the one or more sides may extend from the microwave shielding base layer to the microwave shielding top layer and connect the microwave shielding base layer and the microwave shielding top layer, the microwave sensitive component may comprise one of: a processor control device, a spiral inductor, a frequency and sensitivity tunable resonator, a transmission line, a transmission line compensator, an inductance and capacitance resonator, a transmission line resonator, a qubit, a coupler, a pair of qubits and couplers, a superconducting quantum interference device switch, an amplifier, a readout resonator, a capacitor, and an interchip connection or bond, and the microwave shielding base layer may have a major face that is planar and a periphery that extends about the major face, the footprint of the microwave shielding base layer delimited by the periphery, and the one or more sides extend from at least a portion of the periphery, proud of the major face.

According to an aspect, there is provided a method of forming a component of a superconducting integrated circuit, the method comprising depositing a first metal layer, depositing a dielectric layer overlying at least a portion of the first metal layer, the dielectric layer comprising $Nb_2O_5$, wherein depositing the dielectric layer comprises depositing $Nb_2O_5$ by atomic layer deposition, and depositing a second metal layer overlying at least a portion of the dielectric layer.

According to other aspects, the method may further comprise annealing to change a phase of the $Nb_2O_5$, annealing to change the phase of the $Nb_2O_5$ may comprise annealing at between 400° C.— 800° C. for between 10 minutes and 30 minutes, annealing to change the phase of the $Nb_2O_5$ may comprise annealing at between 525° C.— 575° C. for approximately 20 minutes to form $T\text{-}Nb_2O_5$, depositing a first metal layer may comprises depositing one of Nb and Al, and depositing a second metal layer overlying at least a portion of the dielectric layer may comprise depositing one of niobium and aluminum, the method may further comprise depositing a second dielectric layer comprising $Nb_2O_5$ overlying at least a portion of the second metal layer, wherein depositing the second dielectric layer comprises depositing $Nb_2O_5$ by atomic layer deposition, and depositing a third metal layer overlying at least a portion of the second dielectric layer, and depositing a third metal layer overlying at least a portion of the second dielectric layer may comprise depositing one of niobium and aluminum. According to an aspect, there is provided a component of a superconducting integrated circuit, the component comprising a first metal layer, a dielectric layer overlying at least a portion of the first metal layer, the dielectric layer comprising $T\text{-}Nb_2O_5$, and a second metal layer, the second metal layer overlying at least a portion of the dielectric layer.

According to other aspects, the component may be one of a capacitor or a Josephson junction, the component may be a parallel plate capacitor, and each of the first metal layer and the second metal layer may comprise one of niobium and aluminum.

According to an aspect, there is provided a superconducting integrated circuit comprising a first wiring layer, a second wiring layer, and an interlayer dielectric layer comprising $Nb_2O_5$, the interlayer dielectric layer spacing the first component from the second component.

In other aspects, the features described above may be combined together in any reasonable combination as will be recognized by those skilled in the art.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn are not necessarily intended to convey any information regarding the actual shape of the particular elements and may have been solely selected for ease of recognition in the drawings.

DETAILED DESCRIPTION

Figure 1A:
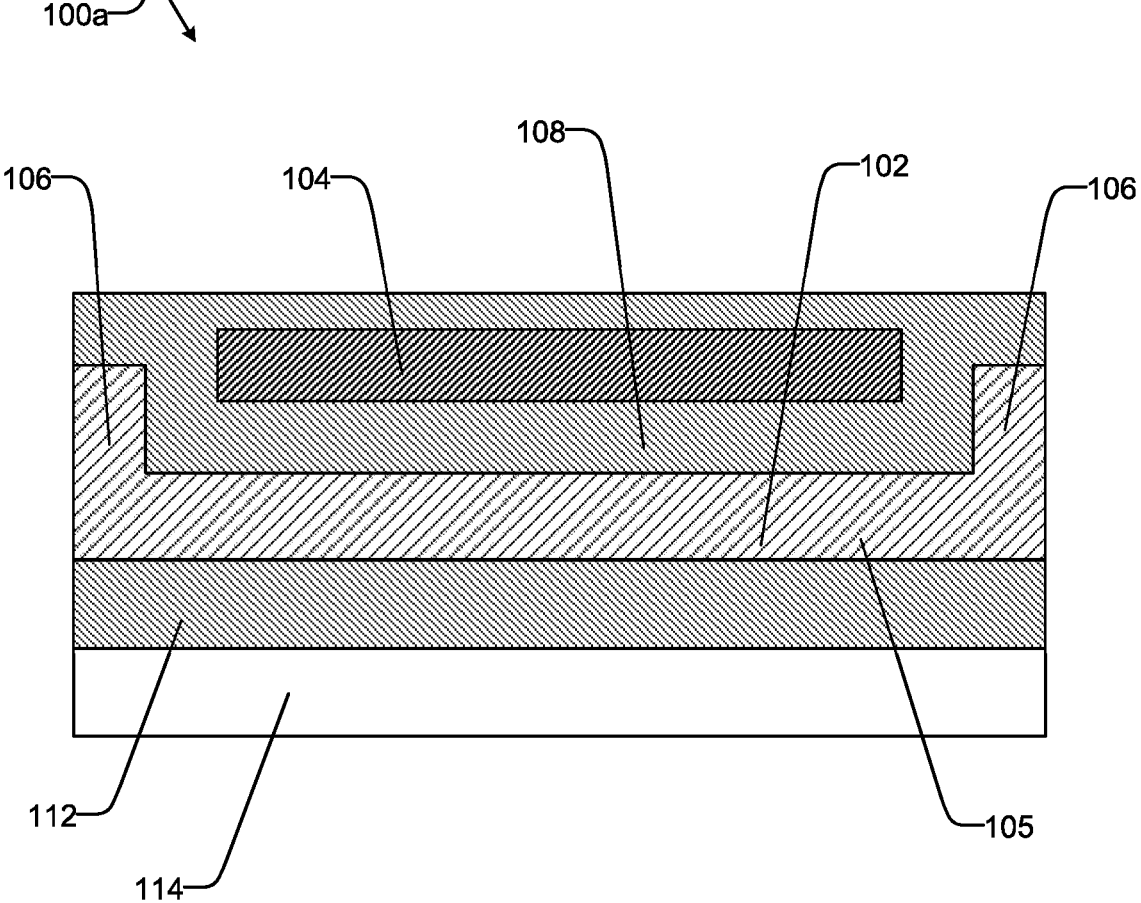
FIGS. 1A and 1B are sectional views of a portion of a superconducting integrated circuit having shielded components.

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

A superconducting integrated circuit may rely on multiple noise-sensitive devices within the circuit to operate. These noise-sensitive devices may be responsive to different types of noise, such as magnetic fields, or microwave signals. In order to optimize the operation of such a superconducting integrated circuit, various noise reduction techniques may be employed. These may include specific layouts to isolate noise sources, shielding of components, and cooling of the superconducting integrated circuit.

A superconducting integrated circuit may be cooled by a refrigerator. The refrigerator may be, for example, a dilution refrigerator and/or a cryocooler, such as a pulse tube cryo-cooler, also referred to in the present application as a pulse tube refrigerator. A superconducting integrated circuit may be cooled to a temperature below 1K. In some implementations, the superconducting integrated circuit is cooled to below 20 mK. In some implementations, the superconducting integrated circuit and the refrigerator are elements of a superconducting computer. In some implementations, the superconducting computer is a superconducting quantum computer.

One of the properties of superconductors is that they expel interior magnetic fields below a critical temperature. External and/or on-chip magnetic shielding may be employed to reduce background magnetic fields during cooldown of a superconducting integrated circuit. See, for example, U.S. Pat. No. 8,441,330, incorporated herein by reference. However, it has been found that on-chip shielding may capaci-tively couple to components such as resonators and qubits, resulting in poor performance. As on-chip shielding is required for effective operation of noise sensitive compo-nents such as qubits, it may be beneficial to prevent this capacitive coupling by providing additional shielding.

As discussed above, one type of component that may be capacitively coupled to a shielding layer is a resonator. In quantum computation, superconducting microwave resona-tors may be used to detect the state of qubits. As these resonators operate using microwaves, the resonators may be affected by stray capacitance coupling within the circuit, or microwave crosstalk from other components within the circuit. These types of interference may limit the perfor-mance of resonators or other microwave components. Stray capacitance coupling may, for example, occur due to the positioning of on-chip magnetic shielding and the position-ing of components such as Superconducting Quantum Inter-ference Devices (SQUIDs) and frequency and sensitivity tunable resonators (FASTRs). It will be understood that qubits may also be influenced by microwave crosstalk. For example, qubits may interact with signals emitted from unshielded resonators. In some instances, a qubit may also be considered a particular example of a microwave resona-tor.

Resonators may be coupled to a common transmission line and integrated through frequency domain multiplexing (FDM). FDM is a technique in which a communication bandwidth is divided into non-overlapping sub-bands, each sub-band used to carry a separate signal. The effective operation of such resonators may be limited by signals from other devices. For example, microwave crosstalk from other microwave components, or capacitance coupling to on chip shielding may both be sources of interference that may limit the operation of superconducting microwave resonators. Generally, microwave crosstalk between components on a chip may be a source of noise or may limit the performance of superconducting integrated circuits. As such, preventing microwave cross-talk between components may improve the operation of the superconducting integrated circuit.

It may therefore be beneficial to provide designs for superconducting integrated circuits that include elements for shielding microwave sensitive components. In the present specification, the phrase "microwave sensitive component" or "microwave sensitive device" may refer to components and/or devices that transmit microwaves and may interfere with the performance of other on chip devices. The phrase "microwave sensitive component" or "microwave sensitive device" may alternatively refer to devices that are affected by microwaves and may have their performance limited by exposure to microwaves. It may be beneficial in both sce-narios to provide shielding around such a component to either contain/control internally generated microwaves or prevent interference from externally generated microwaves.

Figure 3:
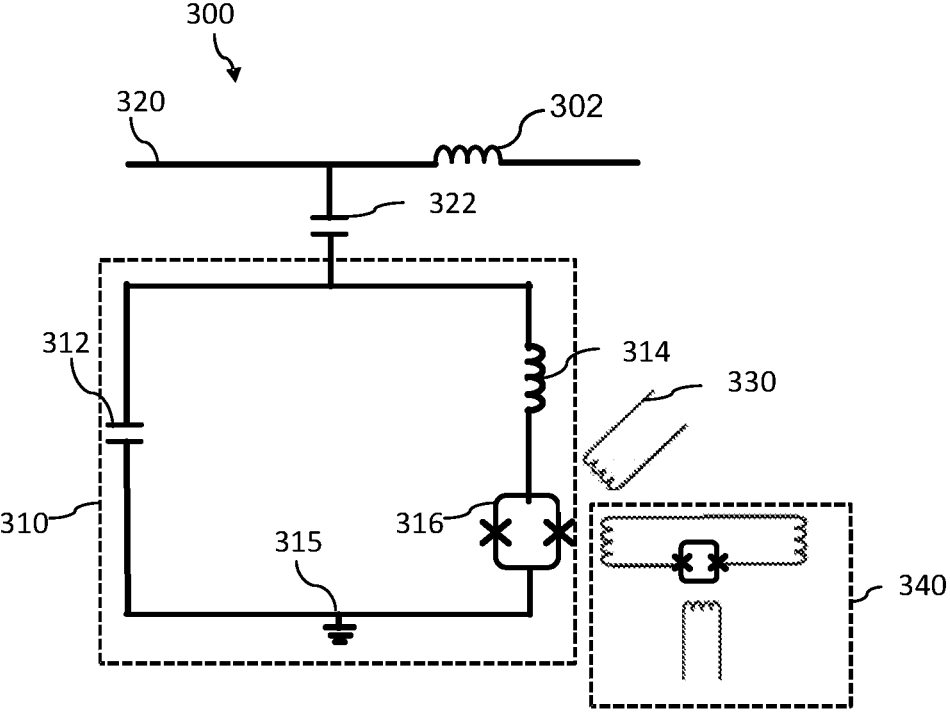
FIG. 3 is a schematic diagram illustrating an example implementation of a superconducting circuit comprising a superconducting resonator able to tune a resonator frequency.

FIG. 1A shows a sectional view of a portion of an example implementation of a superconducting integrated circuit 100*a*, fabricated according to method 300 of FIG. 3. See below for a description of method 300 of FIG. 3.

Superconducting integrated circuit 100*a* includes a micro-wave sensitive component 104 and a microwave shield 102 with microwave shielding base layer 105 and sides 106. The footprint of microwave sensitive component 104 is con-tained within the footprint of microwave shielding base layer 105. Sides 106 extend from microwave shielding base layer 105 around at least a portion of microwave sensitive component 104.

In the depicted implementation of FIG. 1A, microwave shielding base layer 105 is shown below microwave sensi-tive component 104, with microwave sensitive component 104 overlying microwave shielding base layer 105. How-ever, it will be understood that in other implementations it may be beneficial to form microwave shielding base layer 105 to one side of microwave sensitive component 104, or above microwave sensitive component 104.

In the depicted implementation of FIG. 1A, microwave sensitive component 104 is surrounded by a dielectric mate-rial 108. In some implementations, dielectric material 108 may, for example, be $SiO_2$, SiN, or any other suitable dielectric material as is known in the art. It will be under-stood that the form and placement of microwave sensitive component 104 relative to microwave shielding base layer 105 will depend on the form of microwave sensitive com-ponent 104. In some implementations, a lower wiring layer may be too thin to act as a viable microwave shielding layer, and only three metal layers may be available for the forma-tion of microwave shielding base layer 105 and microwave sensitive component 104. In this case, it may be beneficial to provide microwave shielding layer 102 below microwave sensitive component 104 to prevent a microwave field emitted from microwave sensitive component 104 from entering a substrate material such as a silicon wafer.

In some implementations, microwave sensitive compo-nent 104 may be one of: a processor control device, a spiral inductor, a frequency and sensitivity tunable resonator, a transmission line, a transmission line compensator, an inductance and capacitance resonator, a transmission line resonator, a qubit, a coupler, a pair of qubits and couplers, a superconducting quantum interference device switch, an amplifier, a readout resonator, a capacitor, and an interchip connection or bond. For example, microwave shielding layers may be placed around both sides of a bump bond connection formed between a processor chip and a sample holder. As another example, microwave shielding may be placed around coaxial microwave transmission lines. As a further example, where placed around pairs of qubits and couplers, a break may be provided in the shield in the middle of the coupler to allow for communication between each qubit in the pair.

Microwave shield 102 may be placed over other components of superconducting integrated circuit 100a. In the depicted example, microwave shield 102 overlies a dielectric layer 112 and a substrate 114. However, it will be understood that superconducting integrated circuit 100a may also be placed over other structures such as other wiring layers and/or dielectric layers. In some implementations, dielectric material 112 may, for example, be $SiO_2$, SiN, or any other suitable dielectric material as is known in the art. In some implementations, substrate 114 may be formed of silicon, sapphire, quartz, silicon dioxide, or any similar suitable material.

Figure 1B:
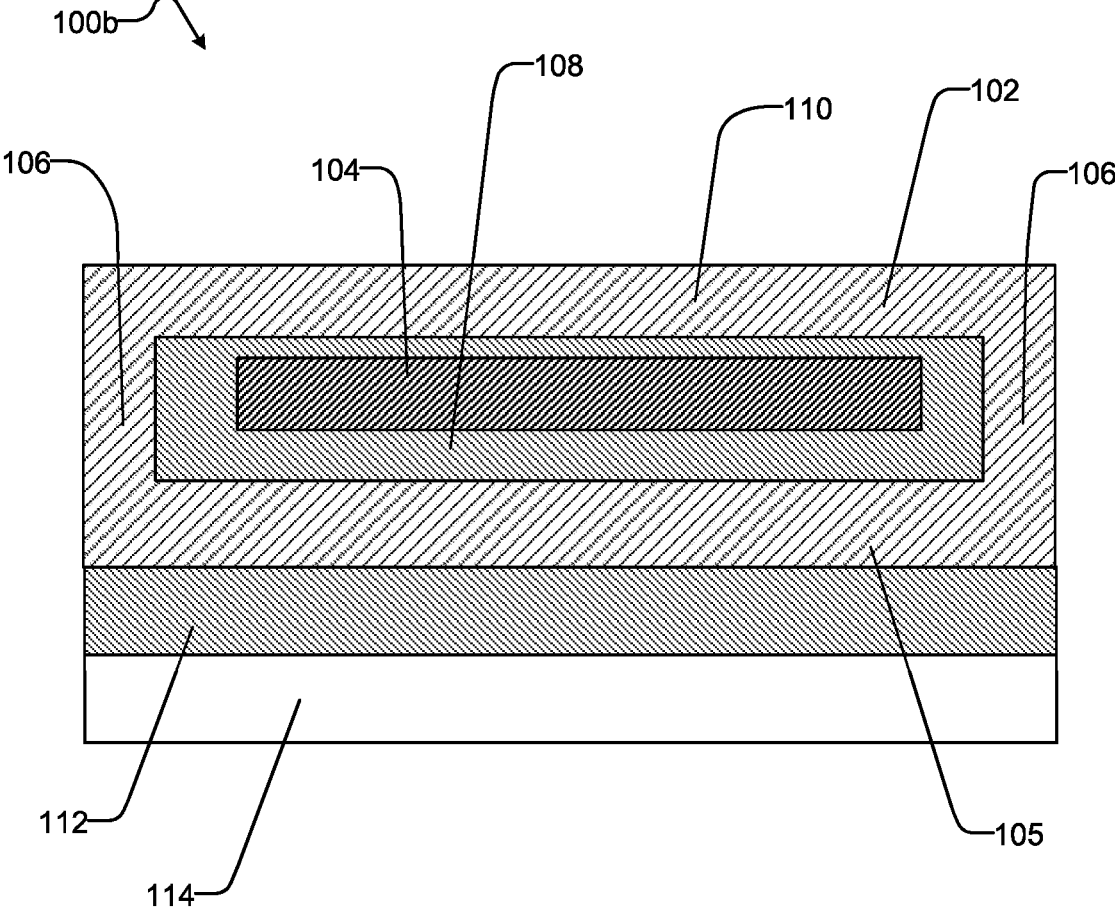

FIG. 1B shows a sectional view of an alternative implementation of superconducting integrated circuit 100a of FIG. 1A, where like numbers identify like components. In this implementation, superconducting integrated circuit 100b has a microwave shielding top layer 110 overlying microwave sensitive component 104. Sides 106 connect between microwave shielding base layer 105 and microwave shielding top layer 110. Dielectric 108 surrounds microwave sensitive component 104.

In some implementations, microwave shielding base layer 105, microwave shielding top layer 110, and sides 106 may be formed of a superconducting material. This may, for example, be a superconducting metal that is deposited during formation of the superconducting integrated circuit. In some implementations, at least one of microwave shielding base layer 105, microwave shielding top layer 110, and sides 106 may be formed from niobium. In other implementations at least one of microwave shielding base layer 105, microwave shielding top layer 110, and sides 106 may be formed from aluminum.

These microwave shielding layers are formed of a material that is capable of blocking microwaves at a given thickness, and the shielding may beneficially be formed from a layer of superconducting material having a thickness that is sufficient to prevent microwave radiation from penetrating the shielding. In some embodiments the thickness of the shielding may be around 250 nm.

Figure 2:
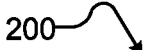
FIG. 2 is a sectional view of a portion of a superconducting integrated circuit having a shielded spiral inductor.
Figure 2:
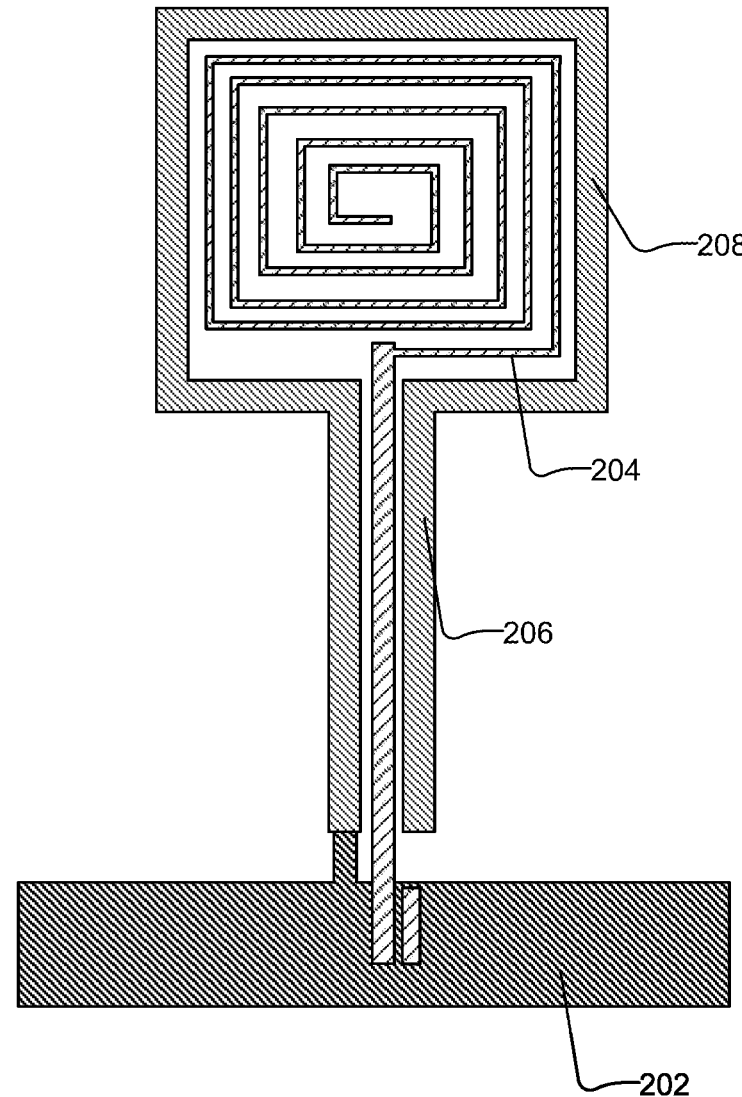

FIG. 2 depicts one implementation of superconducting integrated circuit 100b of FIG. 1B, where microwave sensitive component 204 is provided as a spiral inductor component of a frequency and sensitivity tunable resonator (FASTR). Microwave sensitive component 204 may be a spiral of superconducting material connected to a transmission line 202. In some implementations, microwave sensitive component 204 may be a compensation inductor. The spiral inductor may concentrate magnetic field in the center of the spiral, resulting in broadcasting of microwave fields if left unshielded. The microwave shield 206 around the spiral may form a complete box in three dimensions, aside from a small opening to connect the spiral to transmission line 120. It will be understood that sides 208 are shown, with the microwave shielding base layer being in a lower layer.

While FIG. 1A, FIG. 1B, and FIG. 2 depict a microwave sensitive component in a single layer, it will be understood that the microwave sensitive component may, in some implementations, be formed in multiple interconnected layers of the superconducting integrated circuit. The microwave shield may be formed through multiple layers in order to enclose the microwave sensitive component. In particular, the sides may be provided as a series of interconnected stud vias passing through each of the relevant layers. The dimensions of the microwave shielding layers will typically be determined by the thickness of the corresponding wiring layers. For example, the thickness of each wiring layer may be approximately 300 nm, while the thickness of the dielectric layers may be approximately 200 nm. The width of the vias, and therefore the thickness of the sides of the microwave shield may be approximately 250 nm. However, it will be understood that these are example values, and the width of the shielding may vary based on the material used and the particular implementation.

FIG. 3 depicts an exemplary implementation of a superconducting integrated circuit 300 made up of a transmission line 320, an inductor 302, a superconducting resonator 310, a coupling capacitor 322, a last or final shift register stage 340, and an interface 330. Superconducting integrated circuit 300 may, for example, form part of a readout system of a quantum computer.

Superconducting resonator 310 has a capacitor 312, an inductor 314, and a superconducting quantum interference device (SQUID) 316. Each capacitor 312 and inductor 314 may be made up of multiple discrete capacitors and inductors. The inductor 314 may, for example, include a FASTR as discussed above. Superconducting resonator 310 may be connected at node 315 to ground.

Microwave shielding may be placed around the entire superconducting integrated circuit 300, or around individual components as required. For example, microwave shielding may be placed around inductor 302 in a similar manner to what is depicted in FIG. 2. Shielding may also be placed around the superconducting resonator 310, with openings in the shielding as required for couplings such as those with interface 330 and shift register stage 340.

A superconducting integrated circuit that employs multiple superconducting layers often requires superconducting interconnections between layers. These interconnections are known as "vias." Hinode et al., Physica C 426-432 (2005) 1533-1540 discusses some of the difficulties unique to superconducting vias. The microwave shielding may be formed from a plurality of superconducting stud vias that are formed through layers of the integrated circuit in order to provide a barrier around the microwave sensitive component. In some implementations, the one or more sides may be formed from superconducting stud vias. In the implementations shown in FIG. 1A, FIG. 1B, and FIG. 2, the sides 106 and 208 may be formed from superconducting stud vias.

It will also be understood that where the microwave sensitive component does not interact with another microwave sensitive component, these components may be contained within the same microwave shielding.

Microwave shielding may be formed from the same superconducting material as is used to form the wiring of the superconducting integrated circuit, or an alternative superconducting material may be deposited in order to form the shielding component. In some implementations, the microwave shielding may be formed from layers of niobium, layers of aluminum, or a combination thereof. In an exemplary implementation, the superconducting integrated circuit may be a hybrid circuit as is described in U.S. Provisional Patent Application No. 62/760,253, which is incorporated herein by reference. In this case, microwave shielding may be formed from a combination of niobium and aluminum. The composition of the shielding may be determined by the placement of the microwave sensitive device within the layers.

Figure 4:
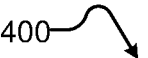
FIG. 4 is a flowchart illustrating a method for forming shielded components.
Figure 4:
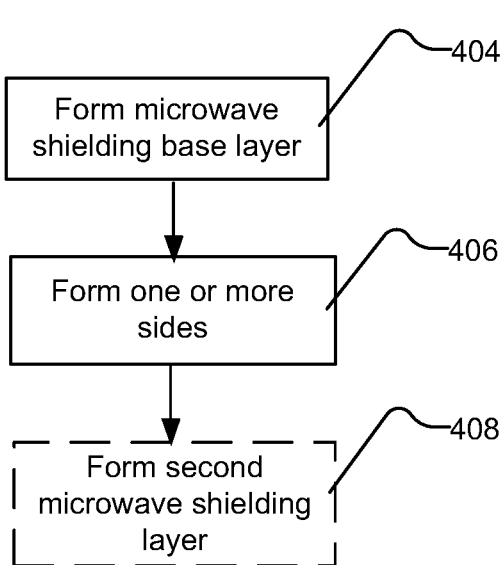

FIG. 4 is a flow chart illustrating a method 400 for mitigating microwave crosstalk in a superconducting integrated circuit having a microwave sensitive component in accordance with the present systems and methods. The microwave sensitive component be one of a processor control device, a spiral inductor, a frequency and sensitivity tunable resonator, a transmission line, a transmission line compensator, an inductance and capacitance resonator, a transmission line resonator, a qubit, a coupler, a pair of qubits and couplers, a superconducting quantum interference device switch, an amplifier, a readout resonator, a capacitor, and an interchip connection or bond. Method 400 includes acts 404-406, with act 408 optionally included, although in other implementations certain acts may be omitted, additional acts may be added, and/or the acts may be performed in different orders. Method 400 may be performed by, for example, integrated circuit fabrication equipment in response to an initiation of a fabrication process. At 404, a microwave shielding base layer is formed.

At 406, sides are formed extending from the microwave shielding base layer around at least a portion of a microwave sensitive component. It will be understood that forming a given microwave sensitive component as discussed above may require multiple processing stages, and that the sides may be formed concurrently with the microwave sensitive component, sides may be formed as a separate process, or as some combination thereof.

It will be understood that the microwave sensitive component may be in different relative positions to the microwave shielding base layer as discussed above. The microwave shield is sized such that the footprint of the microwave sensitive component is contained within the footprint of the microwave shielding base layer. As used herein, "footprint" refers to the area that the component would cover if both the microwave sensitive component and the microwave shielding base layer were projected onto the same plane. Where the microwave shielding layer is positioned below the microwave sensitive component, the microwave shielding layer extends past the perimeter of the microwave sensitive component on the lower plane.

At 408, a microwave shielding top layer may, in some implementations, be provided to overlie the microwave sensitive component. In some implementations it may not be required to provide a microwave shielding top layer, and the microwave shielding base layer and the sides may provide sufficient shielding for the application. The sides may be formed to extend from the microwave shielding base layer to the microwave shielding top layer. In some implementations, the sides may extend to form a box around the microwave sensitive component.

The effectiveness of the microwave shielding layers may be tested by measuring a microwave field in a region spaced from the microwave sensitive component in proximity to the microwave shielding base layer. In order to perform this testing, a microwave detection device may optionally be provided. In some implementations, providing microwave detection device may be performed by providing a vector network analyzer. Vector network analyzers are devices known for use in detection of microwave fields. For example, vector network analyzer techniques are described in "Handbook of Microwave Component Measurements: with Advanced VNA Techniques", Joel P. Dunsmore ISBN: 978-1-119-97955-5 Sep. 2012.

The microwave detection device may be used to verify the effectiveness of the shielding, and it may be beneficial to measure stray microwave fields outside the shielded component in comparison with a similar component without the shielding. This may provide a quantitative prediction of microwave crosstalk that may be generated by the component when the component is incorporated into a larger processor.

In order to further reduce noise in the superconducting integrated circuit, it may be beneficial to combine superconducting microwave shielding with dielectrics that experience low loss. Noise may be further reduced by providing components within microwave shielding in combination with high quality and high coherence dielectrics.

Dielectric layers are used to isolate metal layers within integrated circuits. It is known that defects in the dielectric layers may introduce noise within superconducting quantum devices. It is also known that different dielectric materials have different properties and introduce different levels of noise. Quantum devices may be influenced by noise, resulting in errors being produced during quantum computation.

As discussed above, the performance of microwave components such as FASTRs may be limited by stray capacitance coupling. This impact may be reduced by providing inter-layer dielectrics that are less lossy. One material that has been identified as having beneficial characteristics is niobium pentoxide ($Nb_2O_5$). $Nb_2O_5$ may be incorporated in lumped-element superconducting resonator structures for quantum computing applications, as well as a tunnel barrier in Josephson junctions, such as through use of atomic layer deposition (ALD).

One commonly used component in a superconducting integrated circuit is a parallel plate capacitor, which is formed by two layers of superconducting material forming capacitor plates spaced by a dielectric material. The use of lossy dielectric materials between capacitor plates may result in the capacitor dielectric leeching energy from the circuit, as well as generating heat. Heat generated within a superconducting integrated circuit may create noise within the circuit.

A component of a superconducting integrated circuit may be formed with a first metal layer of Nb, a dielectric layer of $Nb_2O_5$ overlying at least a portion of the first metal layer, and a second metal layer of Nb overlying at least a portion of the dielectric layer. Annealing may then be performed to form $T-Nb_2O_5$. The component may take a variety of forms, such as a capacitor or a Josephson junction.

Figure 5:
FIG. 5 is a sectional view of a portion of a superconducting integrated circuit including a capacitor.
Figure 5:
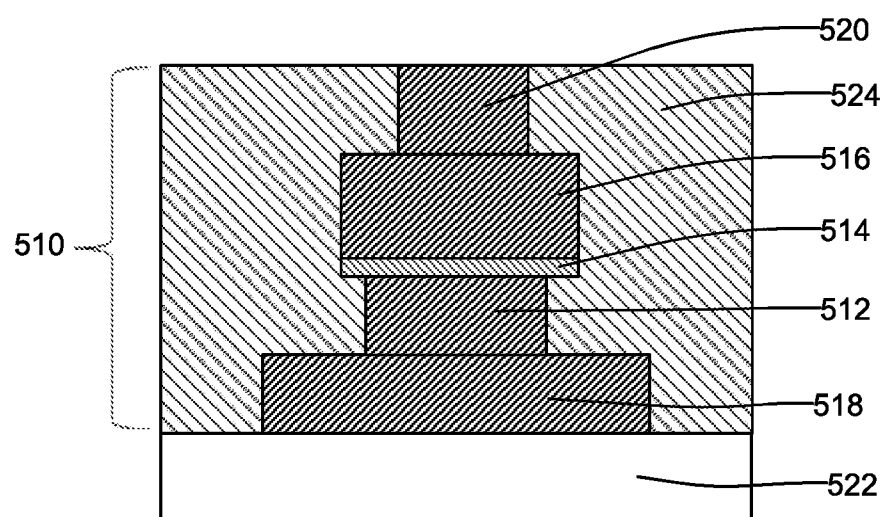

In the exemplary implementation of FIG. 5, component 510 of superconducting integrated circuit 500 includes a first metal layer 512, a dielectric layer 514 overlying at least a portion of first metal layer 512, and a second metal layer 516 overlying at least a portion of dielectric layer 514. In this implementation, component 510 is a parallel plate capacitor. In the depicted implementation, capacitor 510 has top and bottom electrodes 518 and 520. FIG. 5 depicts superconducting integrated circuit 500 formed on a substrate layer 522. However, it will be understood that superconducting integrated circuit 500 may also be placed over other structures such as other wiring layers and/or dielectric layers. In some implementations, substrate 522 may be formed of silicon, sapphire, quartz, silicon dioxide, or any similar suitable material. Superconducting integrated circuit 500 is show as including an interlayer dielectric material 524. The interlayer dielectric material may also be formed of $T-Nb_2O_5$, or it may be formed from an alternative interlayer dielectric material such as $SiO_2$, SiN, or other dielectric materials suitable for use in superconducting circuits as are known in the art.

The capacitance C of a parallel plate capacitor is given by:

$$C = \frac{\epsilon A}{d}$$

where E is the permittivity of the dielectric separating the plates, A is the area of one of the plates and d is the thickness of the dielectric. The capacitance of the parallel plate capacitor may be increased through use of dielectric materials having a higher dielectric constant (E) for the same size of capacitor. As such, better dielectric materials may allow for both reduced size and reduced losses. The dielectric constant of T-Nb$_2$O$_5$ can range from approximately 29 to 200, depending on how the material is made. A capacitor may therefore be made from T-Nb$_2$O$_5$ having a significantly smaller footprint and the same capacitance as a capacitor formed from a lower dielectric constant material. In some implementations, the thickness of dielectric layer 514 within parallel plate capacitor 510 may be 20 nm to 50 nm.

Superconducting quantum devices may include Josephson junctions, which are formed from opposing electrodes formed from superconducting material interrupted by a thin layer of electrically insulating material. A Josephson junction is a small interruption in an otherwise continuous superconducting current path, typically realized by a thin insulating barrier sandwiched in between two superconducting electrodes. Thus, a Josephson junction may be formed as a three-layer, or "trilayer," structure. The trilayer may be deposited completely over a larger area and then patterned to define individual Josephson junctions.

Figure 6:
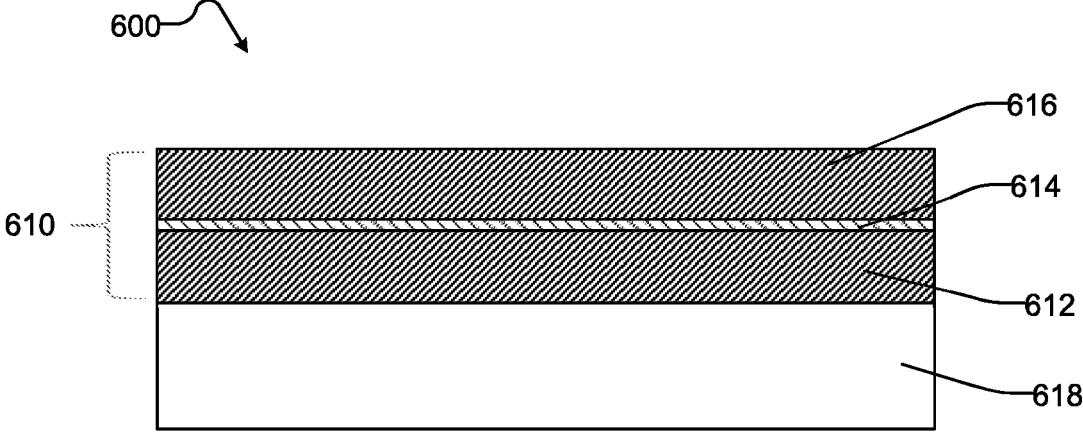
FIG. 6 is a sectional view of a portion of a superconducting integrated circuit including a Josephson junction.

In the exemplary implementation of FIG. 6, component 610 of superconducting integrated circuit 600 includes a first metal layer 612, a dielectric layer 614 overlying at least a portion of first metal layer 612, and a second metal layer 616 overlying at least a portion of dielectric layer 614. In this implementation, component 610 takes the form of a Josephson junction. FIG. 6 depicts superconducting integrated circuit 600 formed on a substrate layer 618. However, it will be understood that superconducting integrated circuit 600 may also be placed over other structures such as other wiring layers and/or dielectric layers. In some implementations, substrate 618 may be formed of silicon or sapphire.

In a multilayered integrated circuit (either semiconducting or superconducting), successive layers of conductive wiring are typically separated from one another by inner layer dielectrics ("ILDs"). ILDs provide structural support for the circuit while electrically insulating adjacent conductive layers. The thickness of an ILD determines the distance between two adjacent conductive layers in the circuit, and this distance influences, among other things, inductive and capacitive coupling between the adjacent conductive layers. In superconducting integrated circuits inductive and/or capacitive coupling between conductive layers can be crucial features of the circuit design. Superconducting integrated circuits are often designed to propagate signals in the form of magnetic flux quanta (e.g., via Single Flux Quantum logic) and often employ deliberate inductive couplings to transfer these magnetic signals. These deliberate inductive couplings can exist between adjacent conductive layers in the circuit and their strength is therefore dependent on the corresponding ILD thickness. Circuits that manipulate magnetic signals are also particularly sensitive to unintended inductive couplings between wiring and circuit elements, often referred to as "crosstalk."

Figure 7:
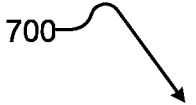
FIG. 7 is a sectional view of a portion of a superconducting integrated circuit including wiring layers and an interlayer dielectric.
Figure 7:
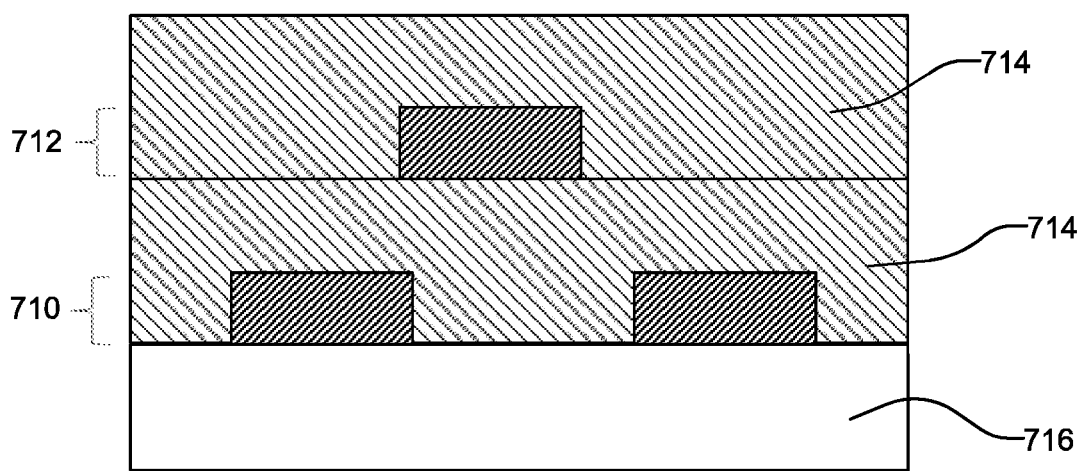

In the exemplary implementation of FIG. 7, T-Nb$_2$O$_5$ may be used as an ILD. Superconducting integrated circuit 700 of FIG. 7 has a first wiring layer 710, a second wiring layer

712, and an interlayer dielectric layer 714 formed from T-Nb$_2$O$_5$. Interlayer dielectric layer 714 spaces first wiring layer 710 from second wiring layer 712. The thickness of each layer shown in FIG. 7 may, for example, be in the range of 200 nm to 300 nm, although it will be understood that the dimensions may vary based on material choice and the nature of the superconducting integrated circuit. FIG. 7 depicts superconducting integrated circuit 700 formed on a substrate layer 716. However, it will be understood that superconducting integrated circuit 700 may also be placed over other structures such as other wiring layers and/or dielectric layers. In some implementations, substrate 716 may be formed of silicon or sapphire.

In the exemplary implementations described above, niobium layers and Nb$_2$O$_5$ layers have been patterned to form various components of an integrated circuit. It will be understood that dielectric materials such as Nb$_2$O$_5$ may be subjected to various types of patterning. For example, the patterning processes taught by U.S. Pat. No. 9,768,371, which is incorporated herein by reference, may be used for Nb$_2$O$_5$. In a preferred implementation, Nb$_2$O$_5$ may be deposited by ALD, and may be annealed to change the phase of the Nb$_2$O$_5$ to a form that has beneficial material properties. Annealing may, in some implementations, be performed at temperatures in the range of 400° C.-800° C., and may preferably be performed at temperatures in the range of 525° C.-575° C. Annealing may, in some implementations, be performed for 10 to 30 minutes, and may preferably be performed for approximately 20 minutes. Annealing at 525° C.-575° C. for 20 minutes may result in Nb$_2$O$_5$ changing phase into T-Nb$_2$O$_5$. It may be beneficial to perform annealing to change the phase of Nb$_2$O$_5$ as Nb$_2$O$_5$ is amorphous after depositing with ALD, and post-annealing T-Nb$_2$O$_5$ is a crystalline form. Use of a crystalline material as a dielectric may result in a higher quality dielectric that is less lossy and less noisy than Nb$_2$O$_5$ that has not been annealed.

In an exemplary implementation, ALD Nb$_2$O$_5$ is provided in an Al/Nb$_2$O$_5$/Al parallel-plate capacitor for use within a lumped element resonator. The ALD process may be performed with (tert-butylimido)-tris(diethylamino)-niobium as a precursor and H$_2$O as a reactant and may be deposited at 275° C. to form a 50 nm thick film. Annealing may be performed at 600° C. for 20 minutes in nitrogen.

Figure 8:
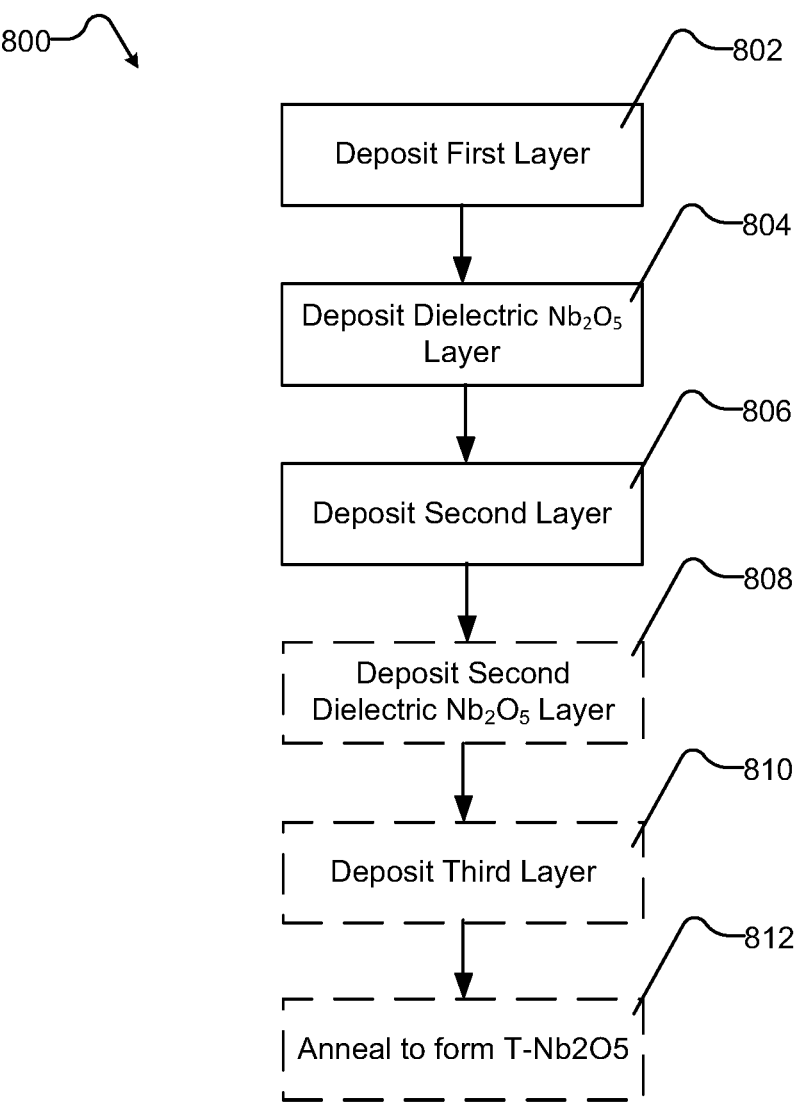
FIG. 8 is a flowchart illustrating a method for fabricating a $N_2O_5$ component.

FIG. 8 is a flow chart illustrating a method 800 for forming a component of a superconducting integrated circuit in accordance with the present systems and methods. Method 800 includes acts 802-806, and may optionally include acts 808-812, although in other implementations certain acts may be omitted, additional acts may be added, and/or the acts may be performed in different orders. Method 800 may be performed by, for example, integrated circuit fabrication equipment in response to an initiation of a fabrication process.

At 802, a first metal layer is deposited. This first metal layer may be formed from niobium or aluminum.

At 804, a dielectric layer is deposited through atomic layer deposition to overlie at least a portion of the first metal layer. The dielectric layer is formed from Nb$_2$O$_5$.

At 806, a second metal layer is deposited overlying at least a portion of the dielectric layer. The second metal layer is formed from niobium or aluminum.

At 808, the method may optionally include depositing a second dielectric layer formed from Nb$_2$O$_5$ through atomic layer deposition overlying at least a portion of the second metal layer.

At 810, the method may optionally include depositing a third metal layer formed from niobium or aluminum overlying at least a portion of the second dielectric layer.

At 812, annealing may be performed to change the phase of the Nb₂O₅ material. For example, this may include changing the phase to form T-Nb₂O₅.

In other implementations, the method may include forming or depositing other metal layers and other dielectric layers in order to form various components of a superconducting integrated circuit.

Figure 9:
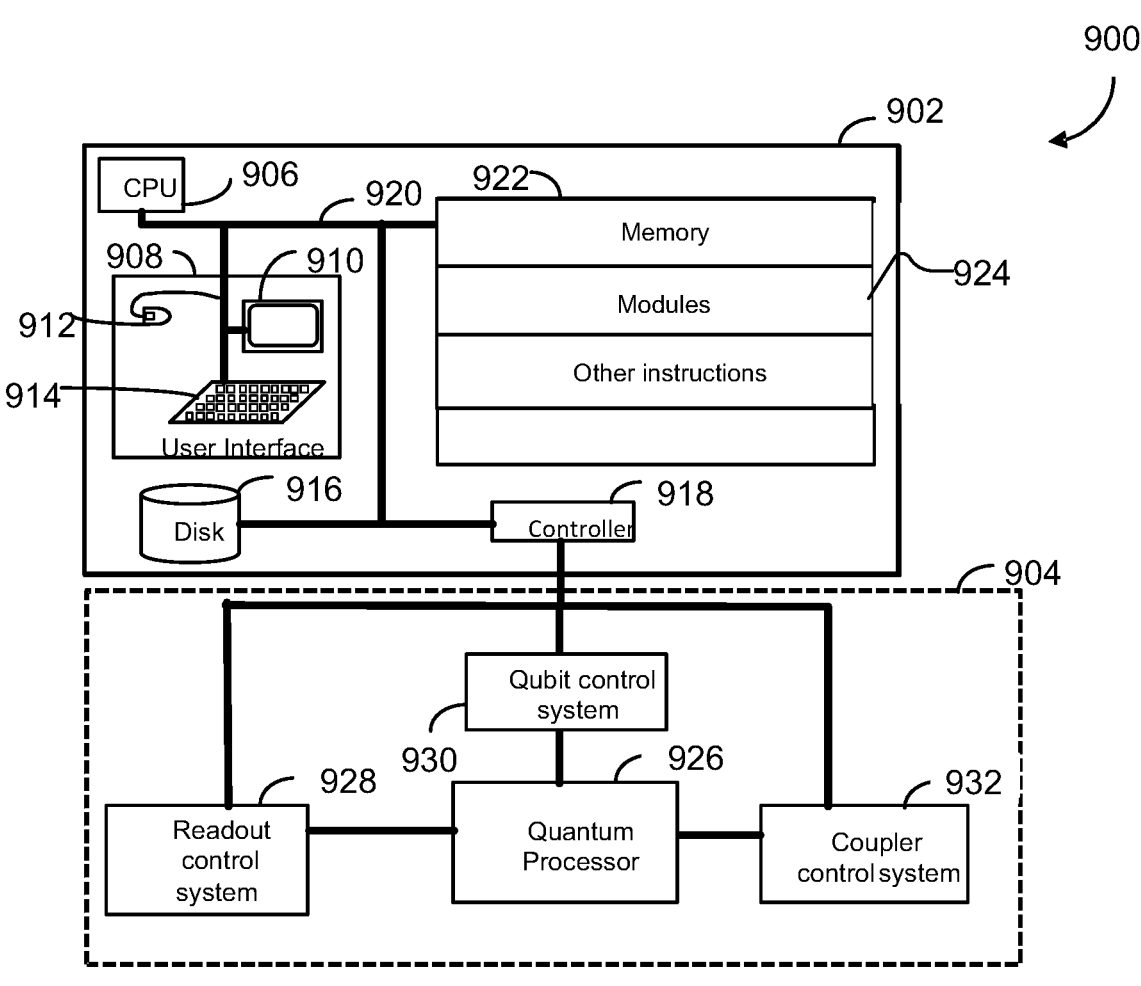
FIG. 9 is a schematic diagram illustrating a computing system comprising a digital computer and an analog computer that includes a superconducting integrated circuit, in accordance with the present systems and methods.

FIG. 9 illustrates a computing system 900 comprising a digital computer 902. The example digital computer 902 includes one or more digital processors 906 that may be used to perform classical digital processing tasks. Digital computer 902 may further include at least one system memory 922, and at least one system bus 920 that couples various system components, including system memory 922 to digital processor(s) 906. System memory 922 may store a set of modules 924.

The digital processor(s) 906 may be any logic processing unit or circuitry (for example, integrated circuits), such as one or more central processing units ("CPUs"), graphics processing units ("GPUs"), digital signal processors ("DSPs"), application-specific integrated circuits ("ASICs"), programmable gate arrays ("FPGAs"), programmable logic controllers ("PLCs"), etc., and/or combinations of the same.

In some implementations, computing system 900 comprises an analog computer 904, which may include one or more quantum processors 926. Quantum processor 926 may be at least one superconducting integrated circuit that includes microwave sensitive components within microwave shielding layers, components fabricated with low noise dielectrics, and other components fabricated using systems and methods described in the present application. Quantum processor 926 may include at least one integrated circuit that is fabricated using methods as described in greater detail herein. Digital computer 902 may communicate with analog computer 904 via, for instance, a controller 918. Certain computations may be performed by analog computer 904 at the instruction of digital computer 902, as described in greater detail herein.

Digital computer 902 may include a user input/output subsystem 908. In some implementations, the user input/output subsystem includes one or more user input/output components such as a display 910, mouse 912, and/or keyboard 914.

System bus 920 may employ any known bus structures or architectures, including a memory bus with a memory controller, a peripheral bus, and a local bus. System memory 922 may include non-volatile memory, such as read-only memory ("ROM"), static random access memory ("SRAM"), Flash NAND; and volatile memory such as random access memory ("RAM") (not shown).

Digital computer 902 may also include other non-transitory computer- or processor-readable storage media or non-volatile memory 916. Non-volatile memory 916 may take a variety of forms, including: a hard disk drive for reading from and writing to a hard disk (for example, a magnetic disk), an optical disk drive for reading from and writing to removable optical disks, and/or a solid state drive (SSD) for reading from and writing to solid state media (for example NAND-based Flash memory). Non-volatile memory 916 may communicate with digital processor(s) via system bus 920 and may include appropriate interfaces or controllers 918 coupled to system bus 920. Non-volatile memory 916 may serve as long-term storage for processor- or computer-readable instructions, data structures, or other data (sometimes called program modules) for digital computer 902.

Although digital computer 902 has been described as employing hard disks, optical disks and/or solid-state storage media, those skilled in the relevant art will appreciate that other types of nontransitory and non-volatile computer-readable media may be employed. Those skilled in the relevant art will appreciate that some computer architectures employ nontransitory volatile memory and nontransitory non-volatile memory. For example, data in volatile memory may be cached to non-volatile memory. Or a solid-state disk that employs integrated circuits to provide non-volatile memory.

Various processor- or computer-readable instructions, data structures, or other data may be stored in system memory 922. For example, system memory 922 may store instruction for communicating with remote clients and scheduling use of resources including resources on the digital computer 902 and analog computer 904. Also, for example, system memory 922 may store at least one of processor executable instructions or data that, when executed by at least one processor, causes the at least one processor to execute the various algorithms to execute instructions. In some implementations system memory 922 may store processor- or computer-readable calculation instructions and/or data to perform pre-processing, co-processing, and post-processing to analog computer 904. System memory 922 may store a set of analog computer interface instructions to interact with analog computer 904.

Analog computer 904 may include at least one analog processor such as quantum processor 926. Analog computer 904 may be provided in an isolated environment, for example, in an isolated environment that shields the internal elements of the quantum computer from heat, magnetic field, and other external noise. The isolated environment may include a refrigerator, for instance a dilution refrigerator, operable to cryogenically cool the analog processor, for example to temperature below approximately 1 K.

Analog computer 904 may include programmable elements such as qubits, couplers, and other devices. Qubits may be read out via readout system 928. Readout results may be sent to other computer- or processor-readable instructions of digital computer 902. Qubits may be controlled via a qubit control system 930. Qubit control system 930 may include on-chip DACs and analog lines that are operable to apply a bias to a target device. Couplers that couple qubits may be controlled via a coupler control system 932. Couple control system 932 may include tuning elements such as on-chip DACs and analog lines. Qubit control system 930 and coupler control system 932 may be used to implement a quantum annealing schedule as described herein on analog processor 904. Programmable elements may be included in quantum processor 926 in the form of an integrated circuit. Qubits and couplers may be positioned in layers of the integrated circuit that comprise a first material. Other devices, such as readout control system 928, may be positioned in other layers of the integrated circuit that comprise a second material.

Many of the implementations described herein are directed towards applications in superconducting quantum computation. Those of skill in the art will appreciate that the requirements (e.g., tolerable levels of noise) for manipulating quantum information may be more stringent than the requirements for manipulating non-quantum information. Thus, while the various implementations described herein are particularly well-suited for use in the fabrication of a superconducting quantum processor, these teachings may be applied to any application incorporating superconducting integrated circuitry (including applications for which the performance criteria are less stringent). For example, the various teachings provided herein may be applied in single-flux quantum (SFQ) circuits or any circuit employing a Josephson junction. In some instances, applying the present systems and methods in non-quantum computing applications may allow certain constraints to be relaxed. An application of SFQ is likely to be less sensitive to noise than a quantum computing application, and as such a lower temperature dielectric process may readily be applied to an SFQ circuit in order to preserve Josephson junction quality with less regard for the resultant increase in dielectric defects.

The above described method(s), process(es), or technique (s) could be implemented by a series of processor readable instructions stored on one or more nontransitory processor-readable media. Some examples of the above described method(s), process(es), or technique(s) method are performed in part by a specialized device such as an adiabatic quantum computer or a quantum annealer or a system to program or otherwise control operation of an adiabatic quantum computer or a quantum annealer, for instance a computer that includes at least one digital processor. The above described method(s), process(es), or technique(s) may include various acts, though those of skill in the art will appreciate that in alternative examples certain acts may be omitted and/or additional acts may be added. Those of skill in the art will appreciate that the illustrated order of the acts is shown for exemplary purposes only and may change in alternative examples. Some of the exemplary acts or operations of the above described method(s), process(es), or technique(s) are performed iteratively. Some acts of the above described method(s), process(es), or technique(s) can be performed during each iteration, after a plurality of iterations, or at the end of all the iterations.

The above description of illustrated implementations, including what is described in the Abstract, is not intended to be exhaustive or to limit the implementations to the precise forms disclosed. Although specific implementations of and examples are described herein for illustrative purposes, various equivalent modifications can be made without departing from the spirit and scope of the disclosure, as will be recognized by those skilled in the relevant art. The teachings provided herein of the various implementations can be applied to other methods of quantum computation, not necessarily the exemplary methods for quantum computation generally described above.

The various implementations described above can be combined to provide further implementations. All of the commonly assigned US patent application publications, US patent applications, foreign patents, and foreign patent applications referred to in this specification and/or listed in the Application Data Sheet are incorporated herein by reference, in their entirety, including but not limited to: U.S. Pat. Nos. 9,768,371, 8,441,330, 8,247,799, 7,687,938, U.S. Patent Application Publication No. 2018/014563, U.S. Provisional Patent Application No. 62/760,253, U.S. Provisional Patent Application No. 62/962,644, and U.S. patent application Ser. No. 16/481,788.

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A method of mitigating microwave crosstalk in a superconducting integrated circuit, the superconducting integrated circuit comprising a microwave sensitive component, the microwave sensitive component having a footprint and being formed in multiple interconnected layers of the superconducting integrated circuit, the method comprising:

forming a microwave shielding base layer to at least partially shield the microwave sensitive component, the microwave shielding base layer having a footprint;

forming one or more sides extending from the microwave shielding base layer to at least partially shield the microwave sensitive component, including forming at least one shielding layer through multiple layers of the superconducting integrated circuit to at least partially enclose the microwave sensitive component; and forming a dielectric material to surround the microwave sensitive component, the dielectric material disposed between the microwave shielding base layer and the microwave sensitive component and between the one or more sides and the microwave sensitive component, the dielectric material being a silicon compound;

wherein the footprint of the microwave sensitive component is contained within the footprint of the microwave shielding base layer and the one or more sides extend around at least a portion of the microwave sensitive component, and the microwave shielding base layer and the one or more sides form at least a portion of a microwave shield.

2. The method of claim 1, wherein forming a microwave shielding base layer to at least partially shield the microwave sensitive component comprises forming the microwave shielding base layer to underlie the microwave sensitive component.

3. The method of claim 2, further comprising: forming a microwave shielding top layer to at least partially shield the microwave sensitive component, the microwave shielding top layer overlying the microwave sensitive component, and the microwave shielding base layer, the one or more sides and the microwave shielding top layer form the microwave shield.

4. The method of claim 3, wherein forming the one or more sides comprises forming the one or more sides to connect the microwave shielding base layer and the microwave shielding top layer.

5. The method of claim 3, wherein forming the one or more sides comprises forming one or more vias.

6. The method of claim 1, wherein forming at least one of a microwave shielding base layer and one or more sides extending from the microwave shielding base layer comprises forming the at least one of a microwave shielding base layer and one or more sides from one or more of aluminum and niobium.

7. The method of claim 1, wherein forming at least one shielding layer through multiple layers of the superconducting integrated circuit to at least partially enclose the microwave sensitive component comprises forming the at least one shielding layer to have dimensions determined by thicknesses of corresponding wiring layers of the superconducting integrated circuit.

8. The method of claim 1, wherein forming at least one shielding layer through multiple layers of the superconducting integrated circuit to at least partially enclose the microwave sensitive component comprises forming one or more superconducting vias.

9. The method of claim 1, wherein forming the dielectric material to surround the microwave sensitive component includes forming a plurality of dielectric layers to surround the microwave sensitive component by the dielectric material.

\* \* \* \* \*